United States Patent [19]
Galm

[11] Patent Number: 5,555,182
[45] Date of Patent: Sep. 10, 1996

[54] SOURCE QUALITY MONITORING SYSTEM

[75] Inventor: James M. Galm, Shaker Heights, Ohio

[73] Assignee: Cyberex, Inc., Mentor, Ohio

[21] Appl. No.: 433,690

[22] Filed: May 4, 1995

[51] Int. Cl.$^6$ ................................................ G01R 25/00
[52] U.S. Cl. ........................... 364/487; 364/483; 364/481;
 361/85; 361/86; 363/45; 363/46; 363/39;
 307/87; 307/80
[58] Field of Search ................................. 324/102, 103 P,
 324/76.77, 76.78, 602, 606; 363/45, 46,
 39; 361/85, 86, 96, 97; 327/37; 307/87,
 80; 364/487, 483, 481

[56] References Cited

U.S. PATENT DOCUMENTS

| | | | |
|---|---|---|---|
| 3,673,430 | 6/1972 | Donoghue | 307/232 |
| 4,434,407 | 2/1984 | Healey, III et al. | 331/4 |
| 4,510,399 | 4/1985 | Baker | 307/57 |
| 4,634,888 | 1/1987 | Deavenport | 307/48 |
| 4,742,424 | 5/1988 | Kautzer et al. | 361/78 |
| 4,868,513 | 9/1989 | Piercy et al. | 327/7 |
| 4,872,127 | 10/1989 | Nolan | 363/45 |
| 4,879,527 | 11/1989 | Geile et al. | 331/1 A |
| 4,916,329 | 4/1990 | Dang et al. | 307/87 |
| 5,079,688 | 1/1992 | Kido | 363/125 |
| 5,229,651 | 7/1993 | Baxter, Jr. et al. | 307/66 |
| 5,319,514 | 6/1994 | Walsh et al. | 361/59 |

*Primary Examiner*—Ellis B. Ramirez
*Assistant Examiner*—Hal D. Wachsman
*Attorney, Agent, or Firm*—Watts, Hoffmann, Fisher & Heinke Co., L.P.A.

[57] ABSTRACT

A digital signal processor implemented monitoring circuit for detecting phase and magnitude disruptions in multi-phase alternating current input signals. A phase lock loop receives multi-phase alternating current input signals and provides one set of alternating current output signals in phase with a time average of the multi-phase alternating current input signals and provides a second set of alternating current output signals phase shifted in relation to the first set of output signals. In a three phase system the phase lock loop provides six alternating current signals. A demodulation circuit multiplies the first set of output signals from the phase lock loop circuit with the multi-phase input signals to produce demodulated sets of signals. An output circuit coupled to the demodulation circuit sums the first set of demodulated signals to provide a first source quality signal. The second set of demodulated signals is also summed to provide a second source quality signal. By comparing the first and second source quality signals with predetermined quality thresholds the output circuit produces a source quality indication.

20 Claims, 5 Drawing Sheets

_5,555,182_

SOURCE QUALITY MONITORING SYSTEM

FIELD OF THE INVENTION

The present invention concerns an alternating current source quality monitor for evaluating magnitude and phase disruptions in alternating current signals.

BACKGROUND ART

It is often required that electronically powered equipment be protected by a monitoring system that determines the quality of two or more alternating current power sources. The source quality determination is used to decide the suitability of powering a load with a given source. Often the determination of source quality is used to switch from an unsuitable source to a better source. If, for example, one source is above or below pre-set limits, the abnormal voltage condition could damage the load. Also, momentary spikes or sages in voltage can damage the load if the magnitude deviations are of a sufficient magnitude and duration.

Accurate assessment of source quality requires that voltage abnormalities of small magnitude or short duration not cause a source to be categorized as unsuitable. Nuisance switching of loads from one source to another is inefficient.

Prior art source quality assessment techniques typically involve a step of rectifying a three phase voltage, adding the three rectified signals together and smoothing the resulting waveform with a time constant filter. Variations on this basic technique have been used and include rectifying and adding multiple phase shifted copies of the three phase voltages together to improve response time.

U.S. Pat. No. 5,229,651 to Baxter, Jr. et al. which issued Jul. 20, 1993 discusses alternating current monitoring of line signals for use with an uninterruptible power supply. Line signal faults are detected by comparing a presently received cycle of the AC power line signal with a reference waveform that is formed from a composite of waveforms from prior cycles of the AC line signal. An excessive deviation of the current waveform from the reference waveform results in a fault being declared and causes the uninterruptible power supply to provide backup power.

DISCLOSURE OF THE INVENTION

A monitoring system constructed in accordance with one embodiment of the present invention detects phase and magnitude disruptions in an alternating current input signal. The invention has application where two or more alternating current sources are available and the suitability of the two sources is judged to determine which source should be used to energize a load.

A preferred monitoring system has an input circuit for receiving an alternating current input signal and providing a first alternating current output signal that is in phase with a time average of the alternating current input signal. The input circuit also produces a second alternating current output signal phase shifted by a specified amount in relation to the first alternating current output signal.

A demodulation circuit combines the first output signal from the input circuit with the alternating current input signal to produce a first demodulated signal. The demodulation circuit also combines the second alternating current output signal from the input circuit with the input signal to produce a second demodulated signal. The demodulated signals contain information concerning the quality of the alternating current input signal to the monitoring system.

The information content of the demodulated signals is evaluated by an output circuit coupled to the demodulation circuit. The is done by comparing the first and second demodulated signals with predetermined quality thresholds to produce an output indication that can be used to determine which of the two or more sources should be coupled to a load.

One embodiment of the invention assesses the quality of three phase alternating current sources. Each of three alternating current signals of such a source is phase shifted by 120 degrees from the other two. In this embodiment of the invention the monitoring system input circuit provides two sets of three alternating current outputs for demodulation by the demodulation circuit.

In accordance with a preferred embodiment of the invention the input circuit includes a phase lock loop circuit. A phase detector has an input coupled to one of the demodulator outputs. The output from the phase detector is transmitted through a loop filter to a voltage controlled oscillator (VCO) that provides sets of alternating current output signals. One set of three alternating current, output signals from the voltage controlled oscillator are in phase with the three phase alternating current input signals and a second set of three outputs from the voltage controlled oscillator are out of phase with the three phase alternating current input signals.

The operating parameters of the phase lock loop circuit are important to proper operation of the invention. The demodulation circuit extracts data from the alternating current input signal or signals by multiplying these input signals with the output signals from the phase lock loop's VCO circuit. If the phase lock loop tracts the alternating current input too quickly, the demodulation output provides no phase information of interest.

To make the phase lock loop lag behind the input, a specially chosen phase lock loop transfer function is used. A type two control loop is used to assure the steady state phase error between the input signals and the output from the VCO is zero.

The transfer function is chosen so that the phase lock loop reacts slowly to changes in the input signals that are being monitored. Slowly reacting phase lock loops generally have a narrow lock range which means the frequency ranges over which they successfully operate are relatively narrow. To force the phase lock loop of the preferred embodiment of the invention to operate over a wider range of frequencies, a frequency detector is added to the phase lock loop. When the frequencies of the source's multi-phase signals and the output from the VCO are different, the frequency detector will drive the phase lock loop in a direction to cause the VCO outputs to match the frequency of the source waveforms.

The demodulation circuit produces two source quality signals derived by multiplying and then combining the outputs from the VCO with the three alternating current multi-phase inputs signals. These two source quality signals taken together describe the instantaneous complex modulation envelope of the input signal from which are derived instantaneous deviations in magnitude and phase of the alternating current input signals. The results of the in phase multiplication produce the real component of the complex modulation envelope of the input alternating current waveform and the results of the out of phase multiplication produce the imaginary component of the complex modulation envelope of the input alternating current waveform. In a three phase embodiment of the invention, a mixer component at twice the carrier frequency is removed by combining the signals after multiplication. If the two source quality signals deviate too far beyond predetermined thresholds for specified time periods the input signal is viewed as being corrupted.

The above and other objects, advantages and features of the invention are more completely described in the following description of a preferred embodiment of the invention when reviewed in conjunction with the accompanying drawings.

BRIEF DESCRIPTION OF THE DRAWINGS

FIG. 3A is a schematic depiction of six output signals from the phase lock loop of FIG. 3 illustrating the phase relationship of those signals;

BEST MODE FOR PRACTICING THE INVENTION

Figure 1:
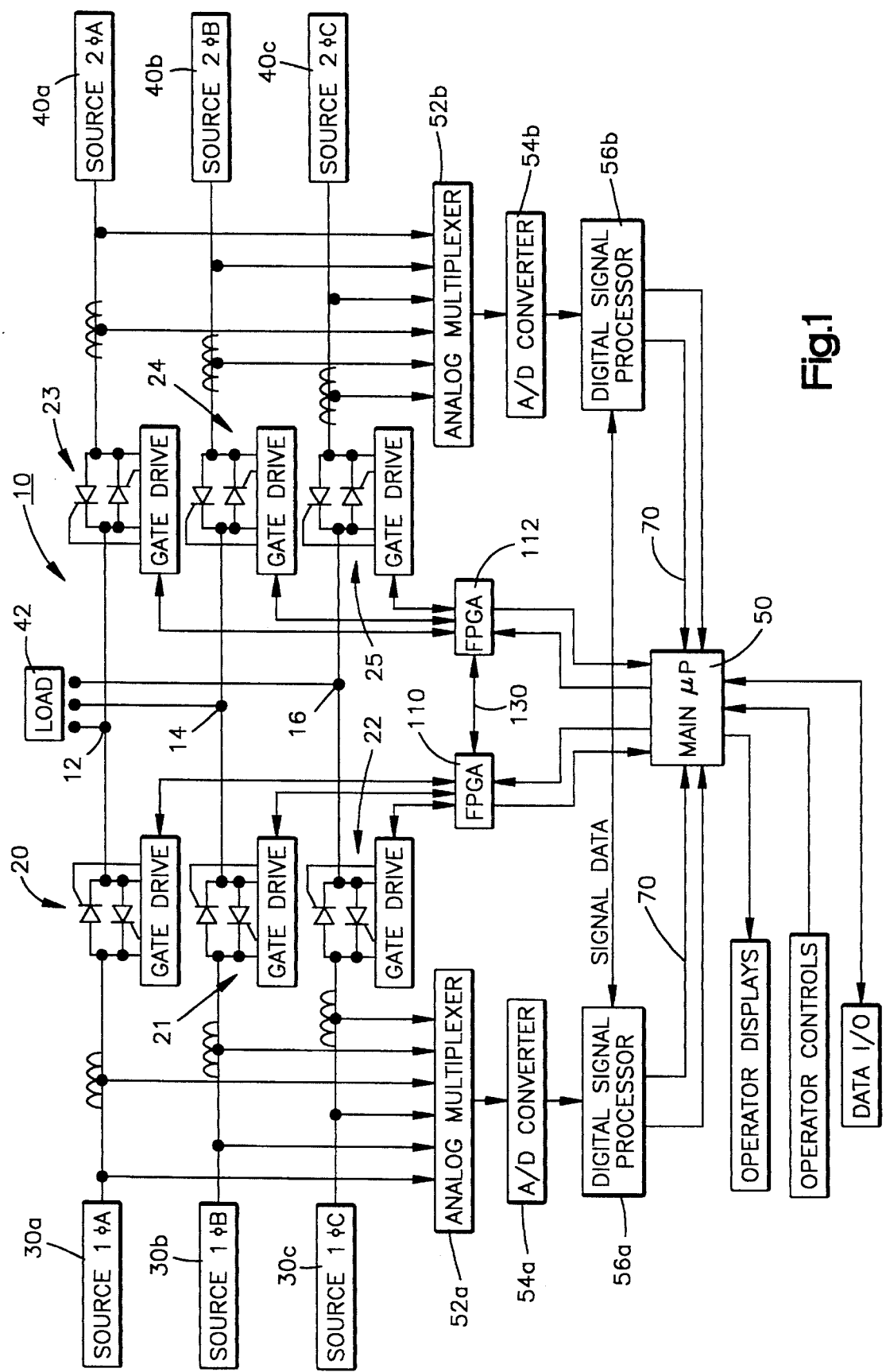
FIG. 1 is a block diagram of a power quality management system which includes a source quality monitor for determining the quality of an alternating current power source.

Turning now to the drawings, FIG. 1 is a block diagram of a control system 10 that controls application of power to a load from either of two alternating current power sources. The control system of FIG. 1 illustrates use of the invention with a three phase power delivery system. The control system 10 has the capacity to switch alternate power sources to a load under varying conditions. One possible use of the control system 10 is in a hospital where it is important that at least some of the electrically powered equipment not lose power and hence a backup power source is made available. The invention also has application in single phase, single or double pole alternating current power delivery systems, or any other alternating current power delivery system where the quality of the alternating current signal is of concern.

The monitoring system 10 provides alternate current paths to three junctions 12, 14, 16 through six sets 20-25 of gate controlled current carrying devices coupled to the junctions 12, 14, 16. A primary three phase power source is coupled to three inputs 30a, 30b, 30c in FIG. 1 and a secondary or backup three phase power source is coupled to three additional inputs 40a, 40b, 40c.

FIG. 1 shows a use of the present invention for controlling energization of a load 42 connected to the junctions 12, 14, 16. The load 42 is powered by either the primary or secondary sources and hence is operatively coupled to either the three inputs 30a, 30b, 30c or the three inputs 40a, 40b, 40c.

A controller 50 monitors the condition of the two sets of alternating current signals from the primary and secondary sources by means of signal condition sensors. A presently preferred controller 50 is implemented using a Motorola 68HC16Z1 based microcomputer including I/O interfacing for communicating with the signal condition sensors. As depicted in FIG. 1 the sensors are connected to the controller 50 by means of analog multiplexers 54a, 54b, analog to digital converters 54a, 54b and digital signal processors 56a, 54b.

Under certain specified conditions that are described in detail below, the controller 50 switches from one power source such as the primary source connected to the inputs 30a, 30b, 30c to a second power source such as the secondary source connected to the inputs 40a, 40b, 40c. To switch from one source to another, the controller 50 must de-active an active group of three current carrying device sets 20–22, for example, and activate an inactive group of three current carrying device sets 23-25. Further details of how this switching occurs are disclosed in co-pending U.S. patent application Ser. No. 08/412,067, entitled "New and Improved Static Switch" filed in the U.S. Patent and Trademark Office on Mar. 28, 1995 which is assigned to the assignee of the present invention and incorporated herein by reference.

The digital signal processors 56a, 56b detect phase and magnitude disruptions in the multi-phase alternating current input signals at the inputs. Thus, the, digital signal processor (DSP) 56a is responsible for monitoring the inputs 30a, 30b, 30c and providing a binary output 70 to the controller 50 that directly indicates the quality of the three phase alternating current signals at the inputs 30a, 30b, 30c. The input signals to the DSP 56a are a digital representation of the alternating waveforms at the inputs 30a, 30b, 30c. Co-ordinated A/D conversion and multiplexing of the analog waveforms results in the DSP 56a receiving sampled data representations of the source signals.

Digital Signal Processor

Figure 2:
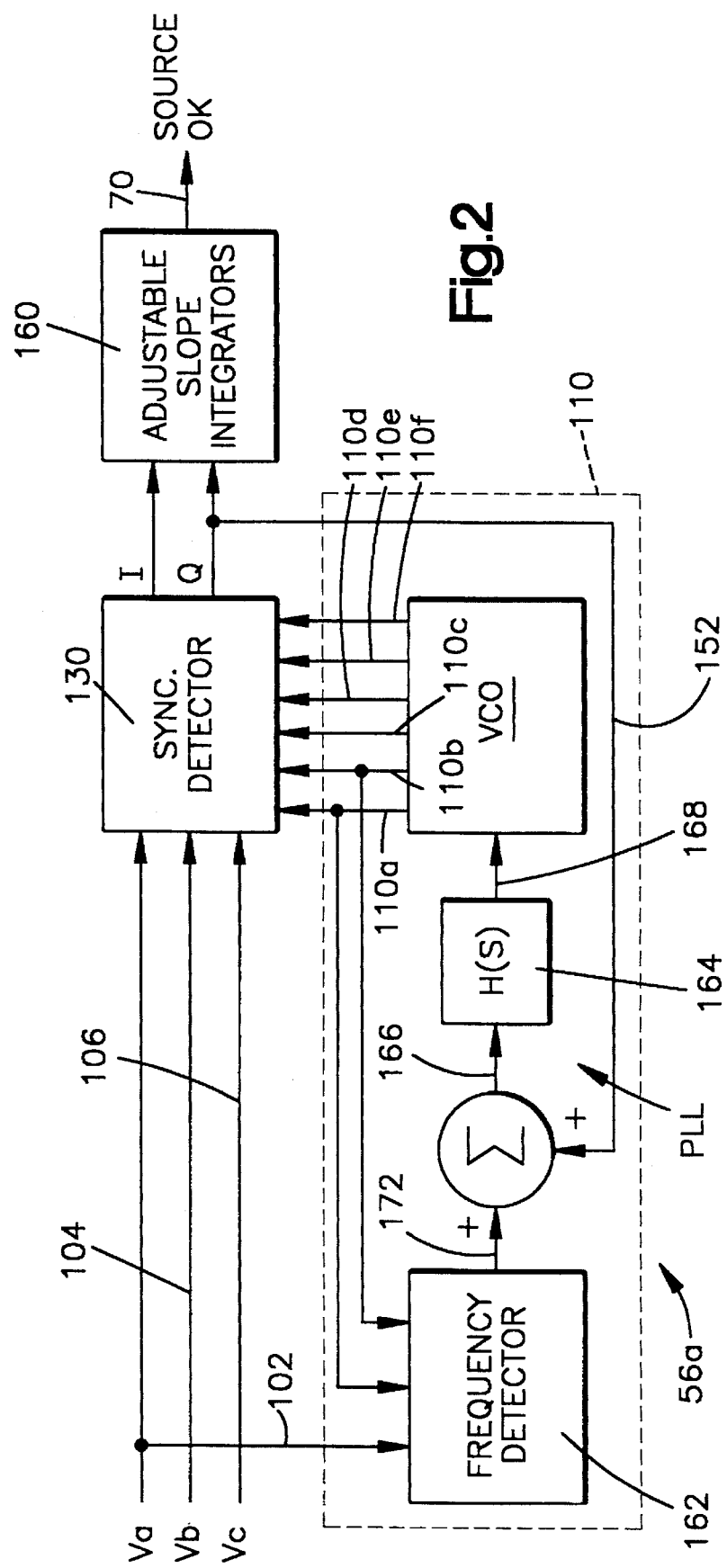
FIG. 2 is a block diagram of a source quality monitor implemented in a digital signal processor shown in FIG. 1.

FIG. 2 is a block diagram showing components of the two digital signal processors 56a, 56b. The processor 56a receives alternating current inputs 102, 104, 106 and provides six alternating current output signals at outputs 110a–110f from a phase lock loop 110. A first set of three output signals are in phase with a time average of the three multi-phase alternating current input signals. A second set of three alternating current output signals from the phase lock loop 110 are phase shifted by 90 degrees in relation to the first set of alternating current output signals.

A demodulation circuit 130 combines the output signals from the phase lock loop circuit 100 with the three alternating current input signals 102, 104, 106 to produce a first set of three demodulated signals 142–144. (FIG. 3) The demodulation circuit 130 also combines the second set of alternating current output signals from the phase lock loop circuit 110 with the input signals 102, 104, 106 to produce a second set of three demodulated signals 146–148.

In a three phase source input quality system, the demodulation circuit 130 also combines the first set of demodulated signals 142–144 to provide a first source quality signal at an output 150. The second set of demodulated signals 146–148 are combined to provide a second source quality signal at an output 152. An output circuit 160 compares the first and second source quality signals 150, 152 with predetermined quality thresholds to produce the output 70.

The six waveforms that are combined with the signals 102, 104, 106 are generated by a voltage controlled oscillator VCO in the phase lock loop 110. The six VCO waveforms are sine waves of the same frequency that are displaced in phase angle with respect to each other by precisely fixed amounts.

Figure 3:
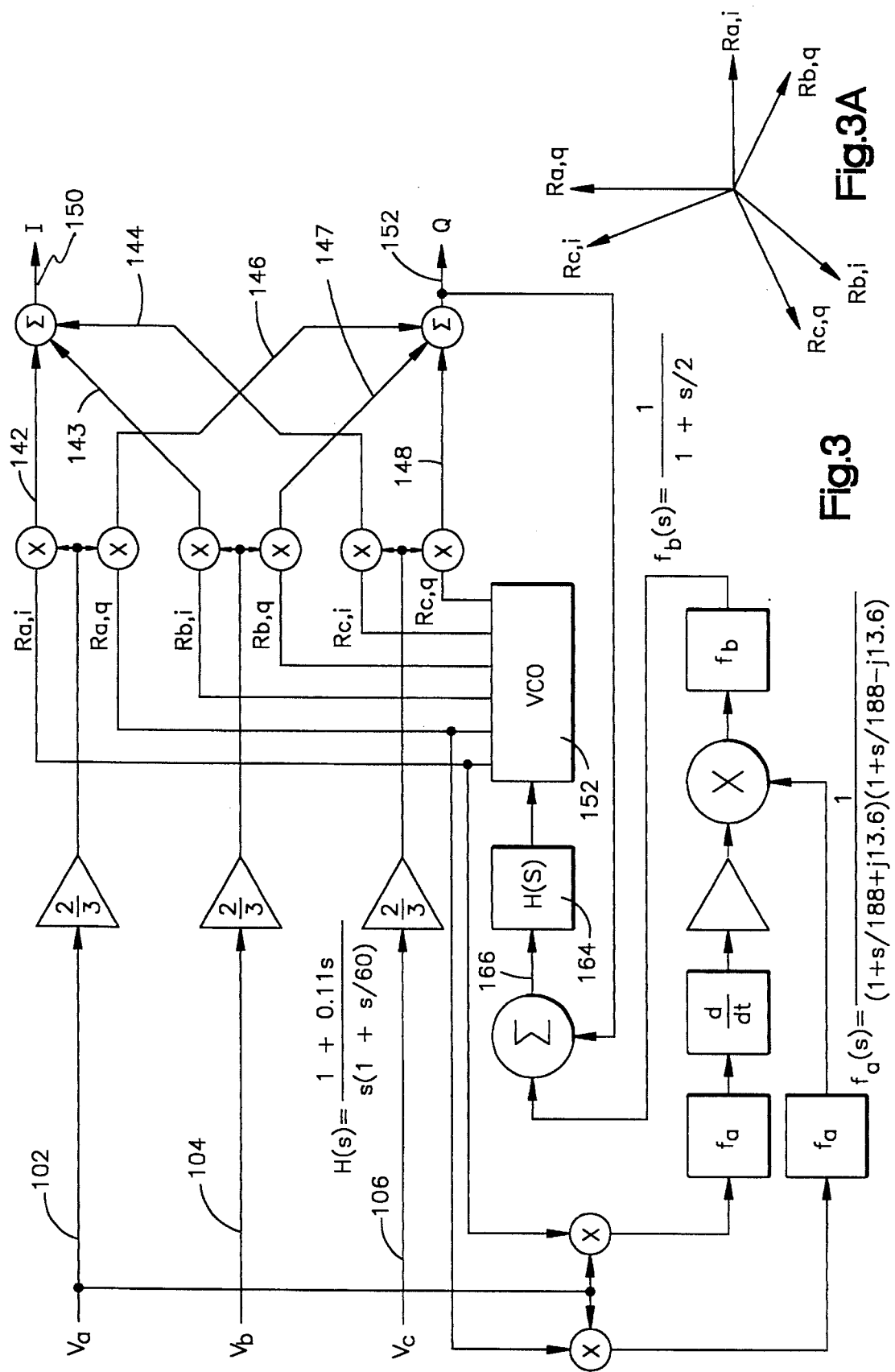
FIG. 3 is a block diagram of a phase lock loop that generates a series of signals in synchronism and in phase quadrature with alternating current input signals from a power source that is coupled to a demodulation circuit for creating two source quality output signals.

The output of the demodulation circuit 130 is a pair of signals designated I and Q in FIG. 3. These two signals I, Q are interpreted as the coordinates of a point on a plane of complex numbers. A point on the complex plane (See FIG. 6 for the co-ordinates of such a plane) is then represented as I+jQ. The demodulation circuit thus continuously outputs the location of a point on the plane that at any instant is the net complex modulation envelope of the three phase input waveforms. Of importance to the present invention is the fact that adding together the three phase sinusoidal waveforms results in cancellation of a mixer frequency product normally associated with product detection. As a result no frequency filtering is required to remove unwanted mixer products.

Phase Lock Loop 110

FIGS. 2 and 3 disclose the components of a phase lock loop 100 that is implemented in the digital signal processors 56a, 56b. The phase lock loop includes a voltage controlled oscillator VCO, frequency detector 162, and a first order loop filter 164. The theory of a phase lock loop is explained in the textbook entitled "Phase-Locked Loops" by Roland E. Best, Copyright 1984, McGraw-Hill. Chapter 3 of this textbook explains the theory of the linear phase lock loops such as the type implemented in the digital signal processors 56a, 56b and is incorporated herein by reference. The reference "Phase Lock Techniques" by Gardner (Copyright, 1979 John Wiley and Sons) is a second text used as an aid in implementing phase lock loops filter functions. The phase lock loop is characterized by a control transfer function having an input 166 which is derived from the angular difference between the source wave form 102 and two VCO outputs 110a, 110b. The VCO is driven by an output 168 from the first order loop filter to achieve a PLL control function.

Figure 4:
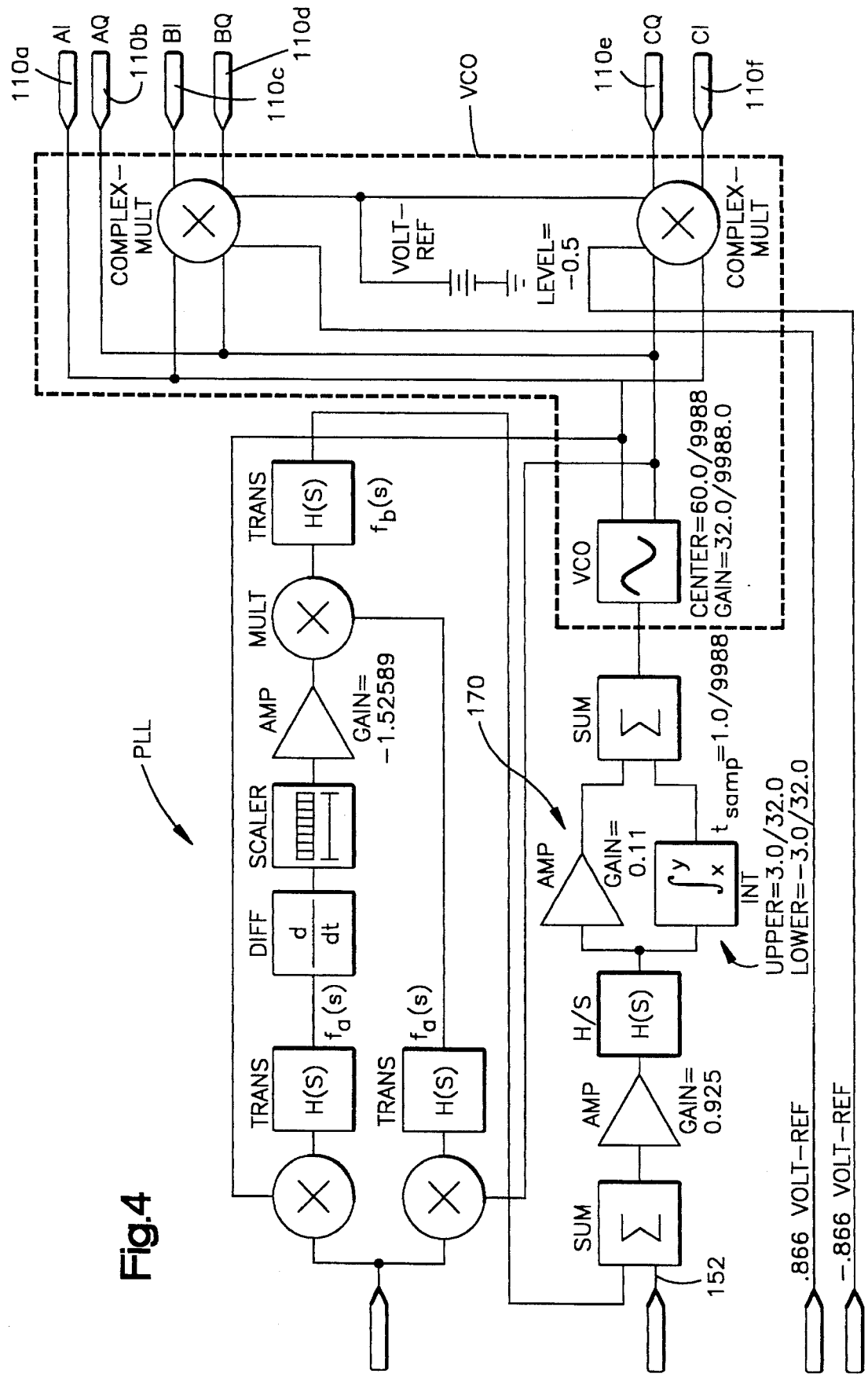
FIG. 4 is a diagram of components that make up the source code for implementing the phase lock loop of the digital signal processor.

The disclosed PLL 110 utilizes an additional integrator loop 170 (See FIG. 4). By use of a type two loop control the steady state phase error associated with the PLL 110 will be zero, thereby guaranteeing accurate synchronous demodulation of the source wave forms. Furthermore, the PLL 110 is designed to react very slowly to variations or transients in source waveform phase. The phase lock loop time constant is chosen to be longer than the slowest such transient of interest in the input signal. In this way, the VCO waveform outputs appear essentially fixed in time and stable, when compared with the potentially corrupted source waveforms.

Slowly reacting PLL control loops generally have a narrow lock range, i.e. the range of input frequencies over which they will successfully lock on and track phase is very narrow. To force the PLL to operate over a wider range of frequencies, a frequency detector 162 is added to the PLL 110. A frequency detector output 172 is added to the Q signal (phase signal) from the demodulation circuit 130, with the sum forming the input 166 driving the PLL control transfer function.

When the frequencies of the source waveforms and the VCO are different, the phase detector output Q will be zero, and the frequency detector output will drive the PLL to make the frequency of the VCO match that of the source waveform. When the frequencies of the source waveform and the VCO are equal, the frequency detector output drops to zero and the phase detector output takes over to lock the VCO in phase with the source wave form.

When the VCO is operating at a different frequency from the input source waveforms, the Q output from the demodulation circuit is a randomly fluctuating signal with an average value of zero and will not significantly contribute to the phase error input to the transfer function H(s). In this case the frequency detector, made up of two filters fa, fb and associated differentiator depicted in FIG. 3 will cause the VCO to move in the direction to reduce the frequency difference between the VCO and the source input signals 102, 104, 106.

Once the PLL 110 is locked, the use of a type two control loop causes the steady state phase error between the VCO and the input signals 102, 104, 106 to be zero.

Demodulation circuit

FIG. 3 depicts the signal flow through the synchronous detector circuit 130. In this figure the three inputs 102, 104, 106 are depicted as presenting the three phase voltages Va, Vb, Vc of the source that is monitored. The signal Va is multiplied by an associated output from the VCO that is in phase and one that is out of phase. These signals are represented in FIGS. 3 and 3A as R(a,I) and R(a,Q) where the I stands for in phase and the Q stands for phase quadrature. The results of these multiplications are two output signals 142, 146.

In a similar manner the signals Vb and Vc are multiplied by their corresponding VCO outputs. This results in three in-phase mixer product signals 142, 143, 144 and three phase quadrature mixer product signals 146, 147, 148. Each mixer product contains the modulation envelope of the particular phase input signal, along with a mixer product at twice the carrier frequency of the alternating current signal being monitored.

When the mixer product signals are combined by adding them together at two summing junctions 174, 176 this mixer frequency signal is removed. No frequency selective filtering is required to remove unwanted mixer products. It is noted however that in a single phase use of the invention such notch or band pass filters could be added to the demodulation circuit to remove these mixer product signals.

Quality Detection Circuit

As mentioned previously, the Q output from the demodulation circuit is used as a measurement of the phase difference between the VCO outputs and the three input signals 102, 104, 106. Mathematically, the exact angle between the VCO output and the input from the source is arctan(Q/I). For small angles, however, arctan(Q/I) is approximately equal to Q. Treating the phase angle discrepancy as proportion to Q simplifies determining the phase angle difference between the source waveforms and the VCO outputs.

Figure 5:
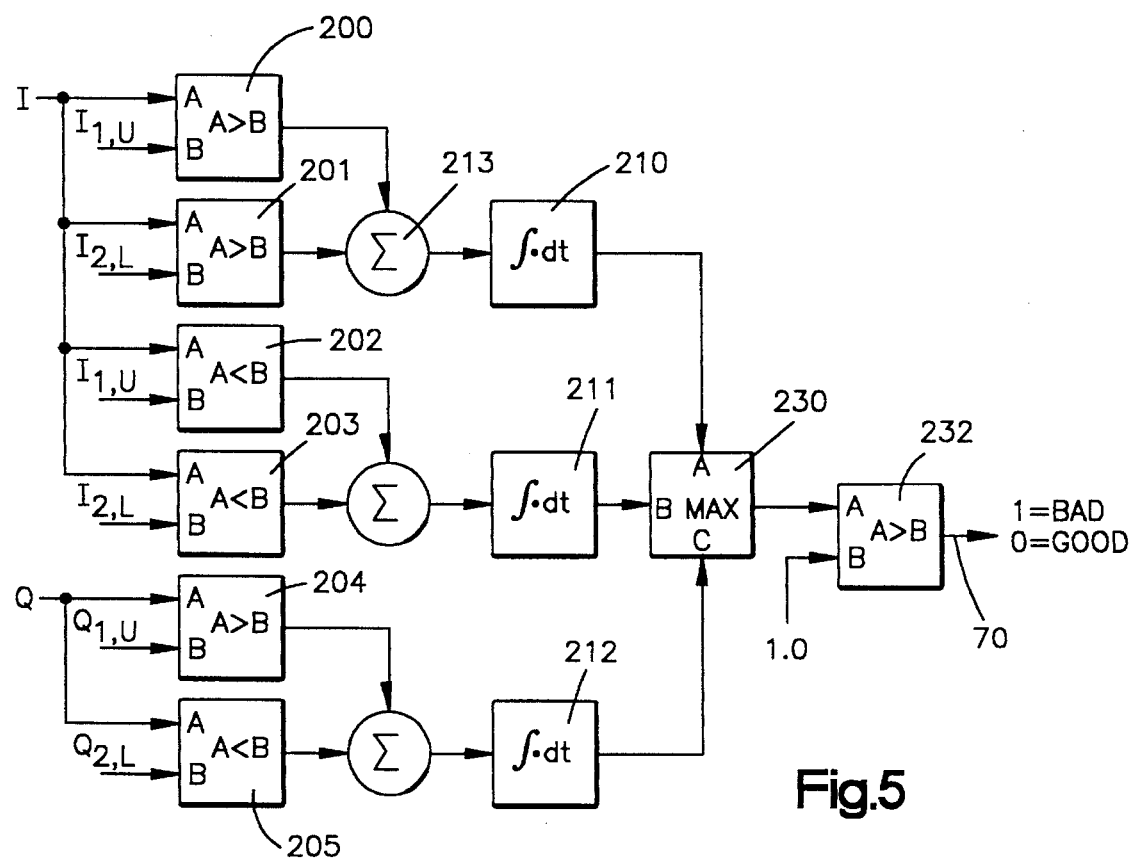
FIG. 5 is a diagram of components for comparing two source quality signals with predefined thresholds.

FIG. 5 is a more detailed depiction of the digital signal processor implementation of the output circuit. The Q and the I inputs are coupled to six comparator circuits 200–205. The combination of the comparators 200–205 and three variable slope integrator circuits 210–212 implement a signal quality determination resulting in a single output 70.

The two signals Q, I define an instantaneous value of the complex modulation envelope of the input signals 102, 104, 106. If the input voltages are of exact nominal magnitude and are not moving in phase with respect to each other, the complex modulation envelope will maintain a constant value of 1+j0. Any deviation in magnitude results in a shift in the radius of the modulation envelope. Any instantaneous phase shift will result in rotation of the modulation envelope around the origin of the complex plane.

Figure 6:
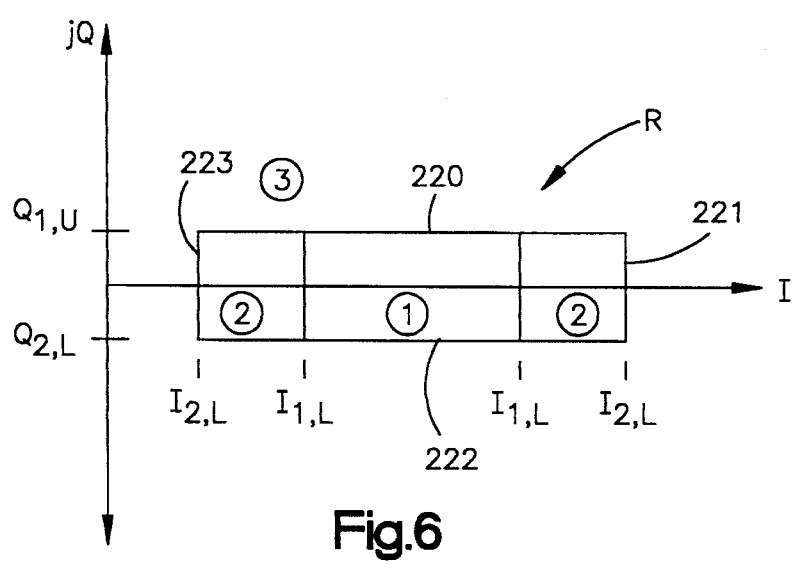
FIG. 6 is a diagrammatic depiction illustrating a manner in which the FIG. 5 components categorize the two source quality signals.

To decide if the input signals 102, 104, 106 are acceptable, the comparators 200–205 define a region of the complex plane depicted in FIG. 6. The size and shape of the viable region R inside bounds 220–223 define tolerances in magnitude and phase disruptions. Excursions from the region R indicate levels of magnitude or phase deviation indicative of a potentially unsuitable power source. Regions progressively more remote from the 1+j0 point indicate magnitude or phase deviations that are progressively more severe. These tolerances are defined by references inputs (B inputs) to the comparators 200–205. The signal from the true and false outputs of the comparators 200–205 are labeled to the side of the comparators.

Short duration deviations from the region R should not be a cause for power source switching. The three variable slope integrators integrate summed outputs from the comparators and produce outputs that are coupled to a maximum signal detector circuit 230. A top comparator 200 receives as an "A" input the real component I of the complex modulation envelope. The reference input at the "B" input defines the boundary between regions 1 and 2 of FIG. 6. If the real Component enters region 2 a value of 1/0.002 is output from the comparator 200. If the real component does not exceed the boundary 221 the output from the comparator 201 is 0.0 and this output from the comparator 200 is the signal that appears at the output from the summing junction 213.

True and False outputs from the comparators 200–205 are listed below in
Table I:

TABLE I

| Comparator | True | False |
| --- | --- | --- |
| 200 | 1/0.002 | −1/0.0025 |
| 201 | 1/0.0005 − 1/0.002 | 0.0 |
| 202 | 1/0.002 | −1/0.0025 |
| 203 | 1/0.0005 − 1/0.002 | 0.0 |
| 204 | 1/0.0005 + 0.5/0.0025 | −0.5/0.0025 |
| 205 | 1/0.0005 + 0.5/0.0025 | −0.5/0.0025 |

If the integrator 210 receives a constant input its output is a linearly increasing function that is presented to the circuit 230. An output from the circuit is coupled to a comparator 232. If the true output from the comparator 200 is received for 0.002 seconds (2 milliseconds) this will integrate to 1.0 and cause the comparator 232 to output a high bit at its output 70. If the true output from the comparator 201 is also transmitted through the summing junction 213, this means the real component has exceeded the boundary 221. This is a more severe disruption and is only tolerated for 500 microseconds before the source is declared to be bad at the output 70. The digital signal processor implements all the processing of signals from the input signals 102, 104, 106 to the generation of an output 70 that is a single bit of information. The preferred DSP implementation is designed with the assistance of a computer aided design software package known as "OR CAD" which allows one to lay out circuit components on a screen similar to the appearance of the components of FIG. 4. When the output from the "OR CAD" software is compiled by an appropriate software program, the result is a binary code for accomplishing the function of the source code components. This binary code is then implemented in a DSP such as one of a number of commercially available digital signal processors. The preferred processor is a 24 bit fixed point processor.

While the present invention has been described with a degree of particularity, it is the intent that the invention include all modifications and alterations from the disclosed design falling within the spirit or the scope of the appended claims.

I claim:

1. Monitoring apparatus for detecting phase and magnitude disruptions in an alternating voltage input signal comprising:

a) an input circuit for receiving an alternating voltage input signal and providing a first alternating output signal that follows a phase of the alternating voltage input signal and for providing a second alternating output signal phase shifted in relation to the first alternating output signal by a specified amount;

b) a demodulation circuit for combining the first output signal from the input circuit with the alternating voltage input signal to produce a first demodulated signal and for combining the second alternating output signal from the input circuit with the alternating voltage input signal to produce a second demodulated signal, said demodulation circuit including circuitry for removing a ripple signal resulting from the combining of signals applied to the demodulation circuit; and c) an output circuit coupled to the demodulation circuit for assessing the quality of the alternating voltage input signal by comparing the first and second demodulated signals with predetermined quality thresholds to produce an output indication of the quality of the alternating voltage input signal.

2. The monitoring circuit of claim 1 wherein the input circuit comprises a phase lock loop circuit that has as an input the alternating voltage input signal and produces two alternating outputs, one in phase and one out of phase with the alternating voltage input signal.

3. The monitoring circuit of claim 2 wherein the phase lock loop circuit has a time constant that is longer than the slowest transient of interest in the alternating voltage input signal.

4. The monitoring circuit of claim 2 wherein the phase lock loop has a type two control loop.

5. The monitoring circuit of claim 1 wherein the circuitry for removing the ripple signal is a filter circuit that extracts certain frequencies from the first and second demodulated signals provided by the demodulation circuit.

6. The monitoring circuit of claim 1 wherein the input circuit receives multiple phase alternating voltage input signals and wherein the circuitry for removing the ripple signal is an adder circuit for combining demodulation signals from each phase of the multiple phase alternating voltage input signals.

7. Monitoring apparatus for detecting phase and magnitude disruptions in multi-phase alternating voltage input signals comprising:

a) a waveform circuit for receiving a number of multi-phase alternating voltage input signals and for providing a first set of alternating output signals that follow a phase of the multi-phase alternating voltage input signals and for providing a second set of alternating output signals phase shifted in relation to the first set of alternating current output signals by a specified amount;

b) a demodulation circuit for combining the first set of output signals from the waveform circuit with the alternating voltage input signals to produce a first set of demodulated signals having suppressed spurious mixer products and for combining the second set of alternating output signals from the waveform circuit with the alternating voltage input signals to produce a second set of demodulated signals having suppressed spurious mixer products; and c) an output circuit coupled to the demodulation circuit for assessing the quality of the alternating voltage input signals by combining the first set of demodulated signals to provide a first source quality signal, by combining the second set of demodulated signals to provide a second source quality signal, and for comparing the first and second source quality signals with predetermined quality thresholds to produce a source quality indication signal.

8. The monitoring apparatus of claim 7 wherein the waveform circuit comprises a phase lock loop circuit having an input for one or more of the multi-phase alternating voltage input signals and multiple outputs for providing alternating output signals that are in phase and phase shifted by 90 degrees with respect to the multi-phase alternating voltage input signals.

9. The monitoring circuit of claim 8 wherein the phase lock loop circuit has a time constant that is longer than the slowest transient of interest in the multi-phase alternating voltage input signals.

10. The monitoring circuit of claim 8 wherein the phase lock loop has a type two control loop.

11. The monitoring apparatus of claim 8 wherein the phase lock loop circuit comprises:
 a) a voltage controlled oscillator for providing alternating output signals at the multiple outputs; and
 b) a control transfer circuit for providing an input to the voltage controlled oscillator that varies in response to the phase and frequency of the multi-phase alternating voltage input signals.

12. The monitoring apparatus of claim 7 wherein the output circuit comprises one summing circuit for combining each of the signals that make up the first set of demodulated signals and a second summing circuit for combining each of the signals that make up the second set of demodulated signals.

13. The monitoring apparatus of claim 7 wherein the output circuit comprises first and second variable slope signal integrators to determine the suitability of the multi-phase alternating voltage input signals based on a magnitude and a duration of the first and second source quality signals.

14. Apparatus for assessing the quality of at least two alternating current sources to determine which of said at least two sources to couple to a load comprising:
 a) switch sets having oppositely connected gate controlled switches for coupling signals from the alternating current sources to a junction coupled to a load;
 c) monitoring circuits for monitoring a current state through the first and second switch sets;
 d) gate control circuits for gating into conduction the switches of the switch sets; and
 e) a controller coupled to the gate control circuits for activating switches in the switch sets by actuating the gate control circuits as said controller determines a quality of the alternating current signals from the alternating current sources coupled to the switch sets;
 f) said controller comprising a phase lock loop circuit for each of said at least two alternating current sources that provides a slowly varying signal in synchronization with at least one alternating current signal of each source and a demodulation circuit for combining the slowly varying signal from the phase lock loop circuit with said at least one alternating current signal to provide a demodulation signal, comparing a demodulation signal with a threshold to provide a source quality signal for each source, and instructing the gate control circuits to activate a switch set based on the comparison between the demodulation signal and the threshold value.

15. Monitoring apparatus far detecting phase and magnitude disruptions in three phase alternating voltage source signals comprising:

a) a phase lock loop circuit for receiving an alternating voltage input signal and providing a first set of alternating current output signals that follow a phase of three phase alternating voltage source signals wherein one of said three phase alternating voltage source signals corresponds to the alternating voltage input signal and providing a second set of alternating current output signals phase shifted in relation to the first set of alternating output signals;
 b) a detector circuit for combining the first set of output signals from the phase lock loop circuit with corresponding ones of the three phase alternating voltage source signals to produce a first set of demodulated signals and for combining the second set of alternating output signals from the phase lock loop circuit with corresponding ones of the three phase alternating voltage source signals to produce a second set of demodulated signals; and
 c) an output circuit coupled to the detector circuit for assessing the quality of the input alternating voltage source signals by combining the first set of demodulated signals to provide a first source quality signal, combining the second set of demodulated signals to provide a second source quality signal, and for comparing the first and second source quality signals with predetermined quality thresholds to produce a source quality indication signal.

16. A method for detecting phase and magnitude disruptions in an alternating voltage source signal comprising the steps of:
 a) receiving an alternating voltage source signal and providing a first alternating output signal that follows a phase of the alternating current source signal and providing a second alternating output signal phase shifted in relation to the first alternating output signal;
 b) combining the first alternating output signal with the alternating voltage source signal to produce a first demodulated signal and combining the second alternating output signal with the alternating voltage source signal to produce a second demodulated signal; and
 c) assessing the quality of the alternating voltage source signal by removing a mixer frequency component from the first and second demodulated signals to provide first and second source quality signals, and comparing the first and second source quality signals with predetermined quality thresholds to produce a resultant source quality indication signal.

17. The method of claim 16 wherein the alternating voltage source signal comprises three phase alternating voltage source signals and the step of providing in phase and phase shifted output signals is performed for each of the three phase alternating voltage source signals to provide a set of three in phase and a set of three phase shifted output signals which are combined with corresponding ones of said three phase alternating voltage source signals to produce first and second sets of demodulated signals which are added together to remove the mixer frequency component.

18. The method of claim 16 wherein in addition to comparing the first and second source quality signals to the thresholds, deviations of said source quality signals beyond the predetermined quality threshholds are monitored for the time durations they exceed said thresholds in producing the resultant source quality indication signal.

19. The method of claim 18 wherein the step of comparing the first and second source quality signals is performed by coupling said source quality signals to comparators that define boundaries of said signals in a complex two dimensional plane and wherein outputs from the comparators define constant magnitude signals that are integrated to provide linearly increasing functions with respect to time that are used to monitor the time durations the quality signals exceed the thresholds.

20. The method of claim 16 wherein the step of providing a second alternating output signal is conducted by phase shifting the second alternating output signal by 90 degrees with respect to the first alternating output signal.

* * * * *